US009483034B2

(12) United States Patent
Soenen et al.

(10) Patent No.: US 9,483,034 B2
(45) Date of Patent: Nov. 1, 2016

(54) TEMPERATURE SENSOR WITH DIGITAL TRIM AND TRIMMING METHOD THEREOF

(71) Applicant: Taiwan Semiconductor Manufacturing Co., Ltd., Hsin-Chu (TW)

(72) Inventors: Eric Soenen, Austin, TX (US); Alan Roth, Leander, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 919 days.

(21) Appl. No.: 13/660,258

(22) Filed: Oct. 25, 2012

(65) Prior Publication Data

US 2013/0136149 A1 May 30, 2013

Related U.S. Application Data

(60) Provisional application No. 61/564,940, filed on Nov. 30, 2011, provisional application No. 61/565,082, filed on Nov. 30, 2011, provisional application No. 61/565,306, filed on Nov. 30, 2011.

(51) Int. Cl.
| | | |
|---|---|---|
| G01K 15/00 | (2006.01) | |
| G05B 11/01 | (2006.01) | |
| G01K 7/16 | (2006.01) | |
| H03M 3/00 | (2006.01) | |
| G05B 15/02 | (2006.01) | |

(52) U.S. Cl.
CPC ............... *G05B 11/01* (2013.01); *G01K 7/16* (2013.01); *G01K 15/005* (2013.01); *G05B 15/02* (2013.01); *H03M 3/344* (2013.01); *H03M 3/458* (2013.01)

(58) Field of Classification Search
CPC ...... G01K 15/00; G01K 7/16; G01K 15/005; G01J 5/522; G01J 5/0003; G05B 11/01; G05B 15/02; H03M 3/344; H03M 3/458
USPC ................... 374/1, 170, 183, 176, 185, 102; 327/512, 513; 702/99, 130; 338/118, 338/129, 323
See application file for complete search history.

(56) References Cited

U.S. PATENT DOCUMENTS

| | | |
|---|---|---|
| 5,465,268 A | 11/1995 | Rainbolt |
| 6,225,926 B1 | 5/2001 | Hayase |
| 6,288,664 B1 * | 9/2001 | Swanson ........................ 341/155 |

(Continued)

OTHER PUBLICATIONS

U.S. Appl. No. 13/546,303, filed Jul. 11, 2012.

(Continued)

*Primary Examiner* — Lisa Caputo
*Assistant Examiner* — Nathaniel T Woodward
(74) *Attorney, Agent, or Firm* — Duane Morris LLP

(57) ABSTRACT

A method for calibrating a temperature sensor comprises: receiving first and second reference voltages from respective first and second tap points within a string of sequentially connected resistive devices of the temperature sensor. Each resistive device has a resistance that varies as a function of temperature. The receiving is performed at two or more known temperatures. A respective code is output corresponding to each respective one of the two or more known temperatures, based on the first and second reference voltages. At least one of the tap points is adjusted, based on the two or more known temperatures and the respective output codes.

21 Claims, 11 Drawing Sheets

(56) References Cited

U.S. PATENT DOCUMENTS

| | | |
|---|---|---|
| 6,956,516 B2 | 10/2005 | Furuichi |
| 7,307,468 B1 * | 12/2007 | Vasudevan .............. G05F 3/30 327/539 |
| 7,629,915 B2 | 12/2009 | Lin |
| 7,646,659 B2 | 1/2010 | Sako |
| 7,733,995 B2 | 6/2010 | Usui |
| 7,898,448 B2 | 3/2011 | Murakami et al. |
| 7,990,304 B2 | 8/2011 | Lim et al. |
| 8,118,483 B2 | 2/2012 | Cox |
| 8,272,781 B2 | 9/2012 | Nale |
| 8,299,646 B2 | 10/2012 | Rockenfeller et al. |
| 8,684,597 B2 | 4/2014 | Cox |
| 2005/0001670 A1 | 1/2005 | Kim et al. |
| 2005/0259496 A1 | 11/2005 | Hsu et al. |
| 2006/0066384 A1 | 3/2006 | Jain et al. |
| 2006/0176052 A1 | 8/2006 | Seo |
| 2007/0152865 A1 | 7/2007 | Melanson |
| 2007/0216468 A1 * | 9/2007 | Duarte .................... 327/513 |
| 2008/0007319 A1 | 1/2008 | Cox |
| 2008/0043556 A1 | 2/2008 | Nale |
| 2009/0313313 A1 | 12/2009 | Yokokawa et al. |
| 2010/0331039 A1 | 12/2010 | Hezar |
| 2012/0249770 A1 | 10/2012 | Hamm et al. |
| 2013/0135131 A1 | 5/2013 | Tai et al. |
| 2013/0135782 A1 | 5/2013 | Roth et al. |

OTHER PUBLICATIONS

U.S. Appl. No. 13/481,990, filed May 29, 2012.
Notice of Allowance dated Oct. 23, 2014, from related U.S. Appl. No. 13/546,303, 9 pages.
Notice of Allowance issued in counterpart U.S. Appl. No. 13/481,900, filed May 29, 2012.

* cited by examiner

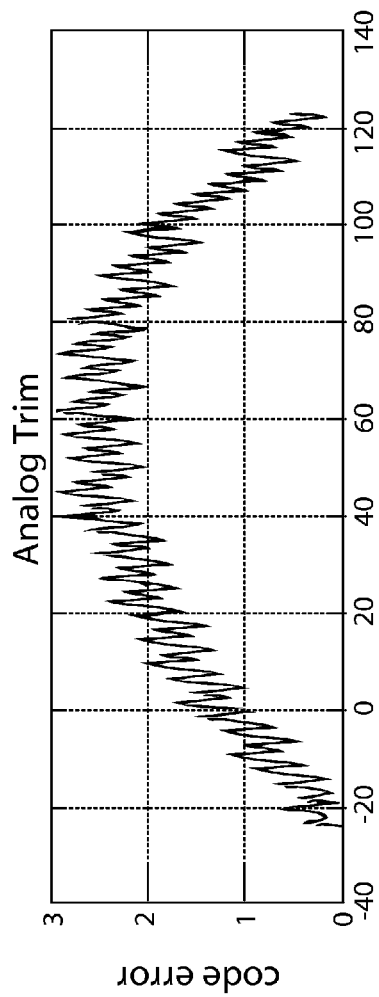
FIG. 7A Analog Trim
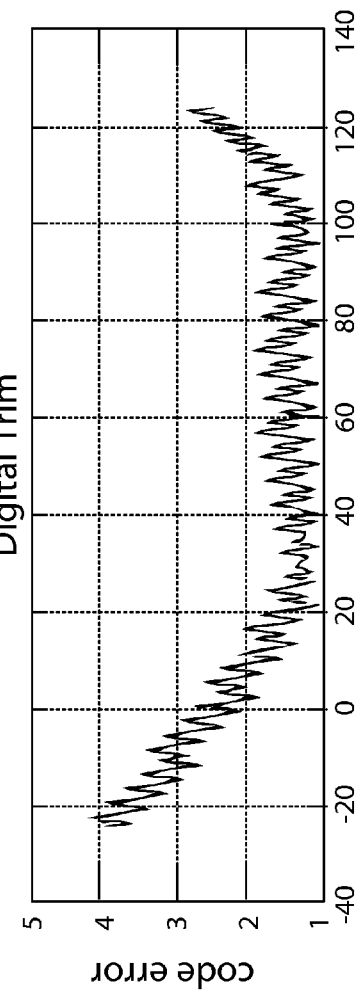
FIG. 7B Digital Trim

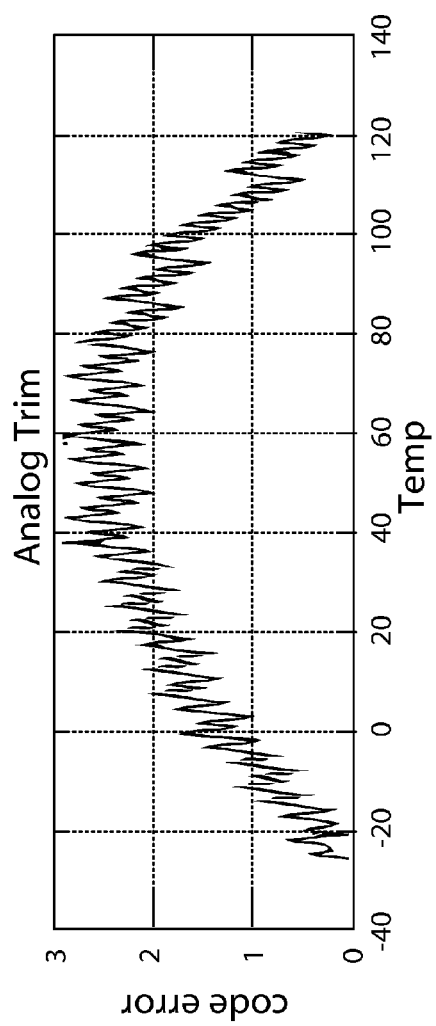
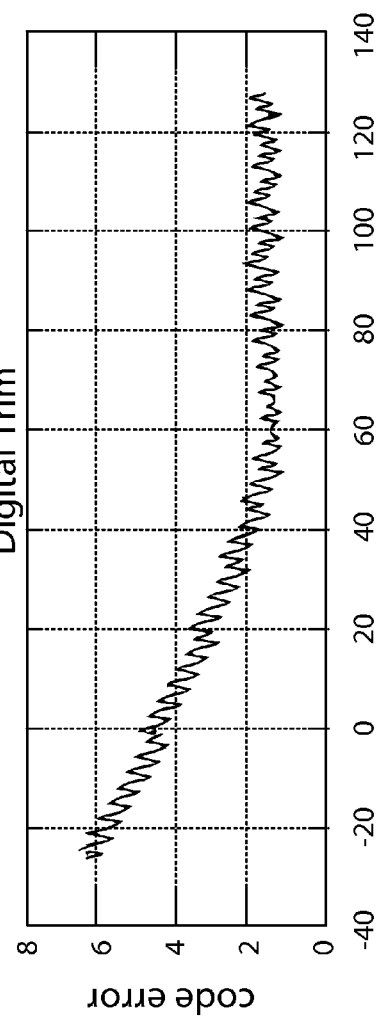

TEMPERATURE SENSOR WITH DIGITAL TRIM AND TRIMMING METHOD THEREOF

This application claims the benefit of U.S. Provisional Patent Application Nos. 61/564,940, filed Nov. 30, 2011, 61/565,082, filed Nov. 30, 2011, and 61/565,306, filed Nov. 30, 2011, all of which are incorporated herein by reference in their entireties.

FIELD

This disclosure relates to integrated circuits generally, and more specifically to temperature sensors.

BACKGROUND

Semiconductor (e.g., silicon) Temperature Sensors are calibrated to reduce the errors associated with the process-voltage-temperature (PVT) variations of silicon and the variations of analog circuits and components.

Silicon Temperature circuits are non-linear. Calibration can be used to compensate for non-linearaties, so that a linear analog-to-digital converter (ADC) can be used to approximate the temperature.

Analog trim have been used for this purpose. Implementing an analog trim technique involves expensive, high-precision analog test equipment and large circuit overhead.

BRIEF DESCRIPTION OF THE DRAWINGS

FIG. 7A is a diagram of sensor error using the analog trim.

FIG. 7B is a diagram of sensor error using the digital trim method, using the same sensor and different calibration points corresponding to a sub-range of the operating temperatures.

FIG. 8A is a diagram of sensor error using the analog trim.

FIG. 8B is a diagram of sensor error using the digital trim method, using the same sensor and another set of calibration points corresponding to a different sub-range of the operating temperatures from those used in FIG. 7B.

DETAILED DESCRIPTION

This description of the exemplary embodiments is intended to be read in connection with the accompanying drawings, which are to be considered part of the entire written description. Terms concerning coupling and the like, such as "connected" and "interconnected," refer to a relationship wherein nodes are electrically connected, either directly or indirectly by way of an intermediate node, unless expressly described otherwise.

An on-chip thermal sensor (thermometer) is provided. On-chip thermal sensors can be used for cell phones, or other applications having a processor on the chip. The sensor monitors the chip temperature accurately. In one embodiment the temperature of a primary CPU is measured. In other embodiments, the temperature of a battery or other chip is monitored/measured. Temperature variations can be attributed to use (power dissipation) or change in ambient temperature. The various monitored chips may have the same or different desired temperature ranges.

In some embodiments, the monitored temperature is provided to a processor which has an algorithm that performs controls/takes action based on the temperature. For example, in some embodiments, the processor controls a cooling fan based on the temperature. In some embodiments described below, the value of a digital output code of the thermal sensor itself is used directly, without first converting the code to a corresponding temperature.

Some embodiments described below provide a temperature sensor having an analog-to-digital converter (ADC) that converts an analog quantity reflective of the temperature to a digital code. Such ADC uses one of more reference level s that can be trimmed, using in-situ measurements and linear interpolation. This digital trim technique requires no additional test equipment. A single measurement and calibration compensates for multiple analog block offsets and non-linearities in a single pass. In some embodiments, measurement and compensation are optimized to the operating point for which highest accuracy is desired.

Figure 1:
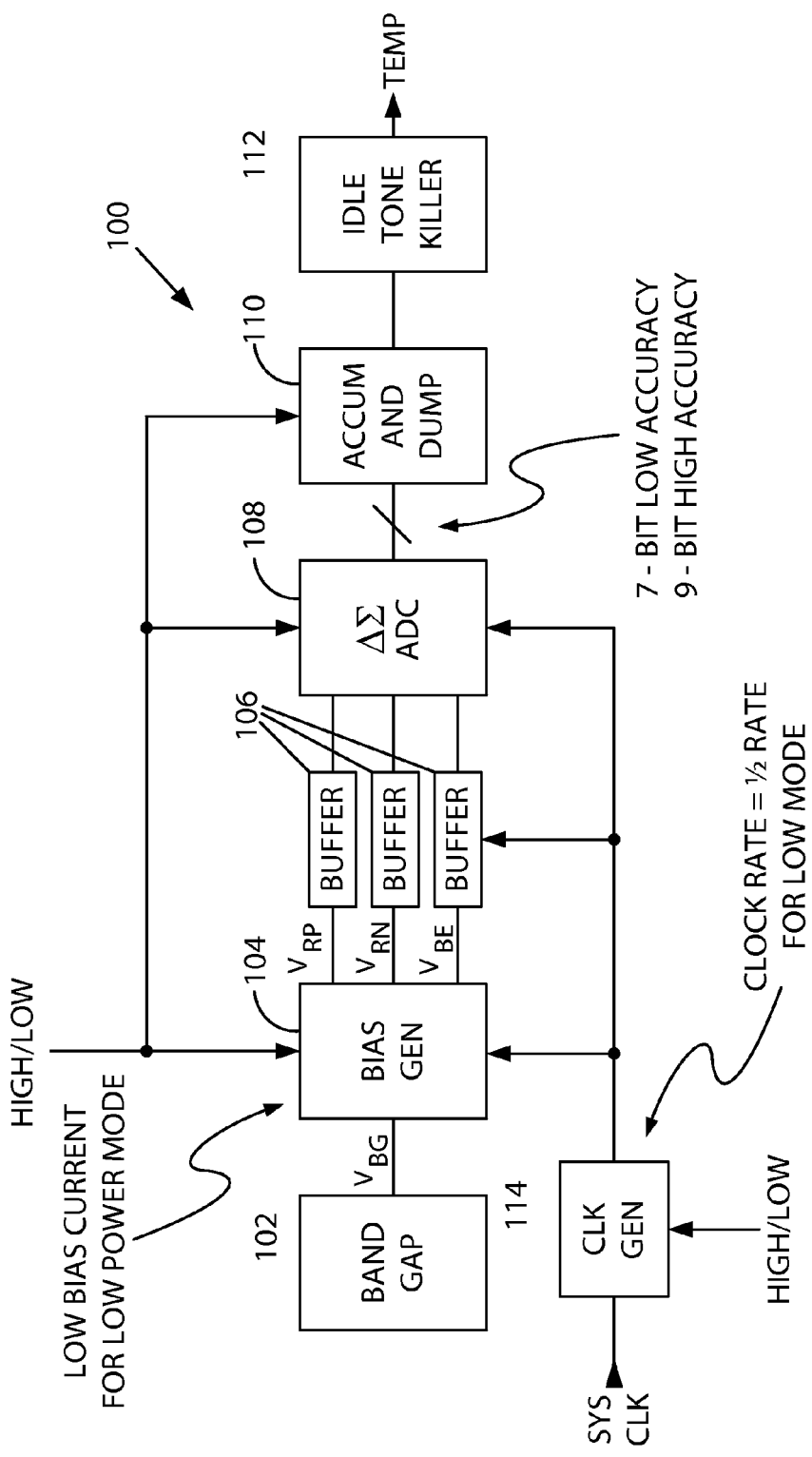
FIG. 1 is a block diagram of a temperature sensor configured for using the digital trim method.

FIG. 1 is a block diagram of a temperature sensor 100. The temperature sensor 100 is based on linear voltage measurement (e.g. a thermal diode). A sigma delta ADC/Comparator 108 compares the incoming analog signal from the thermal diode with a set of Reference Voltages ($V_{RP}$ and $V_{RN}$) to produce a digital code representing the temperature, where $V_{RP}$ represents the minimum temperature, and $V_{RN}$ represents the maximum temperature. $V_{RP}$ and $V_{RN}$ are individually tunable, to provide two independent calibration points. This allows correction of both Gain Errors and DC Offset. $V_{RP}$ and $V_{RN}$ are derived from a string of resistors 124 (FIG. 2) within the bias generator 104 (FIG. 1). In effect, $V_{RP}$ and $V_{RN}$ are adjusted by operating the string of resistors as a digital-to-analog converter (DAC). The DAC generates a different set of two voltages, $V_{RP}$ and $V_{RN}$, depending of what tap points of the resistor string are selected through the analog multiplexer (MUX). In various alternative embodiments, the individual resistive devices within the string 124 can be diffused or implanted resistors, transistors, conductive traces located in the interconnect line layers, or other types of resistor.

Figure 2:
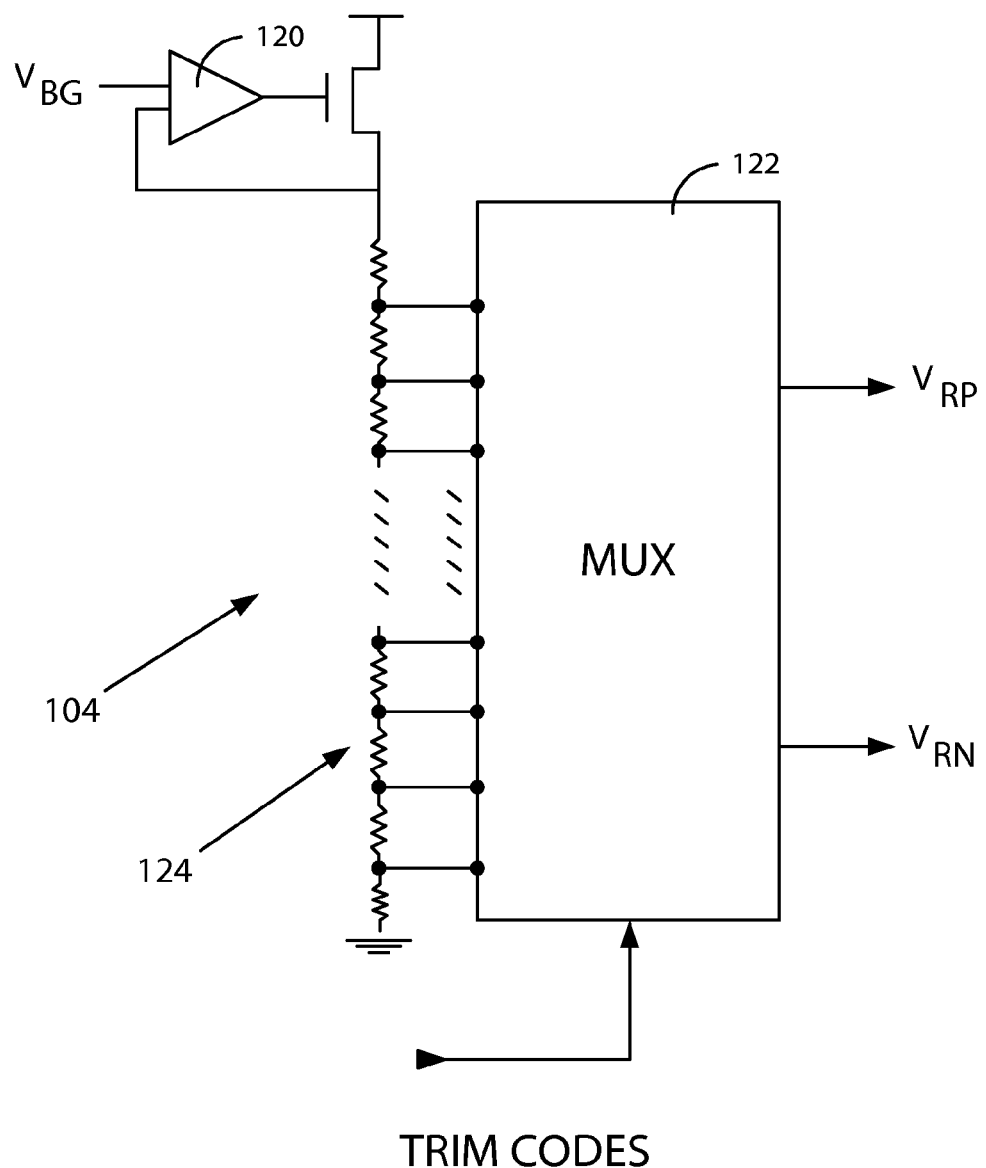
FIG. 2 is a block diagram of an embodiment of the bias generator block of FIG. 1.
Figure 3:
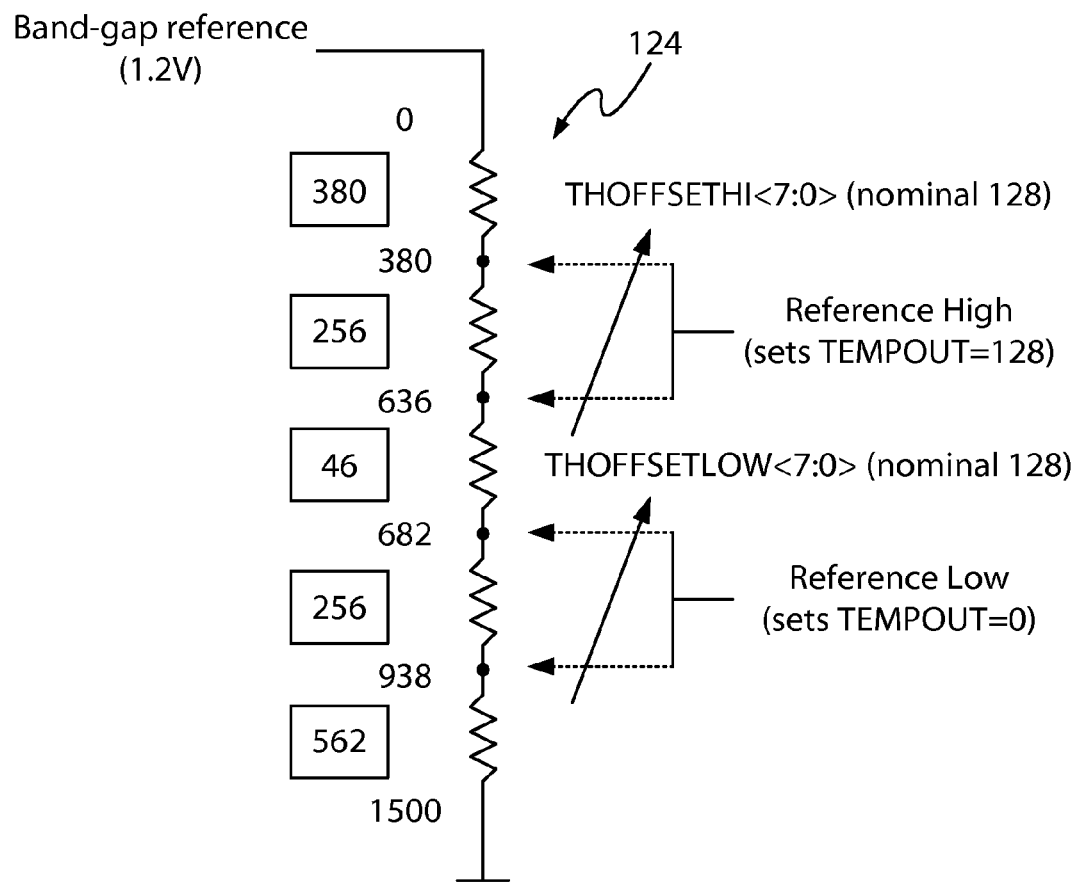
FIG. 3 is a schematic diagram of the bias generator block of FIG. 2.

In some embodiments, the reference voltages $V_{RP}$ and $V_{RN}$ are used as reference voltages for the sigma delta ADC 108. A two-point measurement of the voltage on a thermal diode is used to calculate the actual (or non-ideal) min and max temperatures directly. The actual min temperature is the temperature at which the thermal diode voltage (VBE) is equal to VRP. The actual max temperature is the temperature at which VBE is equal to VRN. A thermal diode normally outputs a decreasing voltage for an increasing temperature. Once the two actual temperatures are determined, they can be used to adjust $V_{RP}$ and $V_{RN}$ so that the min and max temperatures would approach their ideal values. The adjustment can be made using the calibration digital-to-analog converters (DACs) on the reference system, using a multiplexer to select two appropriate tappoints on a resistor string as described above. The DAC is implemented by selecting two tap points on the resistor string within the reference block, using a multiplexer. This is shown in FIGS. 2 and 3. In the example, there are two DAC outputs. Alternatively, in other embodiments, two different DACs operate off the same resistor string, each generating one voltage (VRP or VRN). Using such procedure, ADC and DAC errors are automatically taken into account. This allows the calculations to be made in one pass.

Sensor Operation and Architecture

The thermal sensor 100 is based on the measurement of the voltage across a thermal diode. The thermal diode is within the bias generator 104 of FIG. 1, and provides the output VBE. The diode is forward biased by a controlled reference current. The voltage across the diode provides an indication of temperature. The reference current typically does not have to be highly accurate, because the diode voltage only has limited dependence upon this current.

The relationship between diode temperature and voltage is approximately linear and has a slope of about −2 mV/° C. Over the nominal range of temperatures (−25° C. to 125° C.) the diode voltage changes roughly 300 mV. Other embodiments use different temperature ranges and/or diode voltage range. Still other embodiments use temperature-dependent components that are not diodes.

FIG. 1 is a block diagram of one example of a temperature sensor 100 which can be calibrated using the method. The clock generator 114 receives the system clock signal CLK which can be provided to the chip (e.g., from an off-chip crystal). Three aspects of the circuit of FIG. 1 include the combination/interrelation of (1) How the trim operation is done; (2) Variable precision (low/high power modes) and (3) Idle tone suppression (killer) circuit 112 to monitor temperature. Details of the Variable precision (low/high power modes are provided in U.S. Provisional Patent Application No. 61/565,306, filed Nov. 30, 2011, which is incorporated by reference herein in its entirety.

A band gap voltage reference circuit 102 is provided. The bandgap 102 is a temperature independent reference circuit. In some embodiments, the output voltage $V_{BG}$ of the band gap 102 is about 1.25V. The band gap 102 can receive an unregulated voltage and produce a constant voltage over the range of temperatures. The output of the temperature sensor 100 is a code, which varies as a function of the temperature. In some embodiments, the code value varies from 0 to 127. Other embodiments use different numbers of codes (e.g., from 0 to 255). In the ideal case, the output code of thermal sensor 100 would vary linearly with temperature. In practice, some non-linearity (curvature) may be present due to (1) non-linearity in the temperature to voltage dependency of the thermal diode, (2) slight variation of the band gap voltage with temperature of (3) other circuit effects.

The band gap output signal $V_{BG}$ is provided to a bias generator 104. An example of the bias generator 104 is shown in FIG. 2. The bias generator 104 can include a large string 124 of resistors constituting a voltage divider. In a temperature sensor where the ADC 108 is configured to output a code having N bits (where N is an integer), the string 124 of resistive devices contains more than $2^N$ resistive devices. In some embodiments, the number of resistive devices in string 124 include from about $1.5 \cdot 2^N$ resistive devices to about $2^{N+1}$ resistive devices. In other embodiments, larger or smaller numbers of resistive devices are included, depending on the desired amount of trimming flexibility.

The string of resistors can be tapped at any two locations by the multiplexer 122 to provide two adjustable voltages, as desired. The band gap voltage $V_{BG}$ is input to the head of the resistor string 124 and generates the voltage levels output from the bias generator, which are labeled $V_{RP}$ and $V_{RN}$ (Voltage Reference Positive and Voltage Reference Negative, respectively) shown in FIG. 1. $V_{BE}$ is the voltage which varies according to the temperature of the sensor 100. Thus, $V_{RP}$, $V_{RN}$ are temperature independent, and $V_{BE}$ is temperature dependent.

The resistors in resistor string 124 (FIG. 2) may have process variations. Such process variations can cause errors in $V_{RP}$ and $V_{RN}$ if no trimming is performed. Thus, the string 124 of resistors can be adjusted inside the bias block 104 to provide the exact desired values of $V_{RP}$ and $V_{RN}$. According to one aspect of the method, the voltages VRP and VRN are used as reference voltages for Sigma-Delta ADC 108 (FIG. 1). Adjusting VRP and VRN allows adjustment of both slope and offset of the function expressing the relationship between the diode voltage, VBE, and the output code of the ADC The trimming is a matter of selecting and connecting a subset of the trimming resistors to provide the reference voltages. In some embodiments, a multiplexer 122 is used to select $V_{RP}$ and $V_{RN}$, as shown in FIG. 2 In other embodiments, a bank of electrical fuses (not shown) are provided for selectively disconnecting the taps, except for the two selected taps to be used during operation, as identified by the calibration process. In other embodiments, a bank of antifuses (not shown) are provided for selectively connecting the two selected taps to be used during operation, as identified by the calibration process. In yet other embodiments, the status of one or more digital registers or memory elements is used to select the taps.

Referring again to FIG. 1, the buffers 106 are analog amplifiers, e.g., operational amplifiers. The buffers 106 are expected to have a DC offset, causing errors in $V_{RP}$, $V_{RN}$ or VBE. These errors would cause a slope or offset error in the temperature-code relationship. These offset errors can be trimmed out in the buffers 106 independently, but this involves a precise measurement of the input and output voltages of each buffer.

In some methods, the trimming can all be performed in the buffers 106 by an analog trim. This adds additional circuit complexity and can sometimes result in unwanted parasitics. In some analog trim methods, each analog block is individually calibrated. This can include multiple analog blocks in a single IC, for instance, the ADC, the reference level for that ADC, and any other type of analog blocks are each separately calibrated. This tends to involve extensive testing resources.

Thus, in other embodiments, no analog trim is performed. Instead, a digital trim is performed. Using the method described herein, there is no need to calibrate each block individually or at multiple test points per analog block.

The codes from the output signal TEMP (FIG. 1) are checked. So for purpose of performing the digital trim of this method, it does not matter which block(s) in the analog chain (e.g., band gap 102, bias generator 104, buffers 106) may be inaccurate or non-linear. The method looks at the overall results and makes adjustments to digitally compensate and control the signal, so that the calibrated output is very close to the ideal line 400 of FIG. 4A.

The calibration method looks at a number of output codes (e.g., either 7 bit low accuracy or 9 bit high accuracy code) output from the thermal sensor and corresponding to a number of known temperatures, and corrects for the slope error and the offset in the temperature measurement. The method described herein can be performed regardless of whether there is an error in any of the analog components (the band gap 102, in the bias generators 104, in the buffers 106 or in the delta sigma analog to digital Converter (ΔΣADC)).

The diode voltage is converted by the ADC 108. The ADC 108 is of the first-order, single-bit delta-sigma type. After the output of the ΔΣADC, the circuit accumulates and dumps the code value in block 110. For each conversion, the 1-bit modulator output is integrated for 128 cycles, resulting in an output code, c, between 0 and 128 (7 bits). The accumulate and dump block 110 and idle tone killer 112 are both digital components, and output digital signals.

The reference voltages to the ADC are chosen so that the minimum conversion result (0) would occur when the thermal diode voltage is minimum (125° C.) and the maximum conversion result (128) when the diode voltage is maximum (−25° C.).

Reference Voltage Adjustment

FIG. 3 is a schematic diagram of the bias generator. The two ADC reference voltages $V_{RP}$, $V_{RN}$ can be adjusted independently. This makes it possible to change both the offset and the gain of the ADC 108 in order to precisely calibrate the thermal sensor 100. The reference voltages can be adjusted using externally accessible digital control bits.

During the calibration, the sensor is successively heated to two different, known temperatures (e.g., by setting the temperature on the test equipment or by directly measuring the temperature of the chip itself), and the corresponding two code values are collected. Assuming that the code values are approximately linear in the range including these two temperatures, these two values define a line of code values. This "measured" line can have a slope error and/or an offset relative to an ideal line. Because the actual temperatures and the corresponding measured codes are known, the slope error and the offset with respect to the ideal line can be calculated. Based on this information, the appropriate resistor tap points are selected.

One 8-bit word (THOFFSETHI<7:0>) is used to adjust the upper ADC reference (which controls the temperature at which the ADC output code is 0). The other 8-bit word (THOFFSETLOW<7:0>) is used to adjust the lower ADC reference (which controls the temperature at which the ADC output code is 128).

The two words select tap points on a large voltage divider (resistor string), of which the top is biased at the band-gap reference voltage $V_{BG}$ (in some embodiments, about 1.2V) and the bottom at ground. The reference system and trim procedure is shown schematically in FIG. 3. In one embodiment, the string has a total of 1,500 segments. For the sake of simplicity, each number in a box in FIG. 3 (380, 256, 46, 256, 562) represents a number of identical resistor segments in series. For example, the box 380 represents the top 380 resistor segments.

The resistor string has a uniform step size (each corresponding to one resistor unit). Based on the number of resistors between the tap points for the low and high ADC reference voltage, adjustment values can be calculated.

Two-Point Calibration

Figure 10:
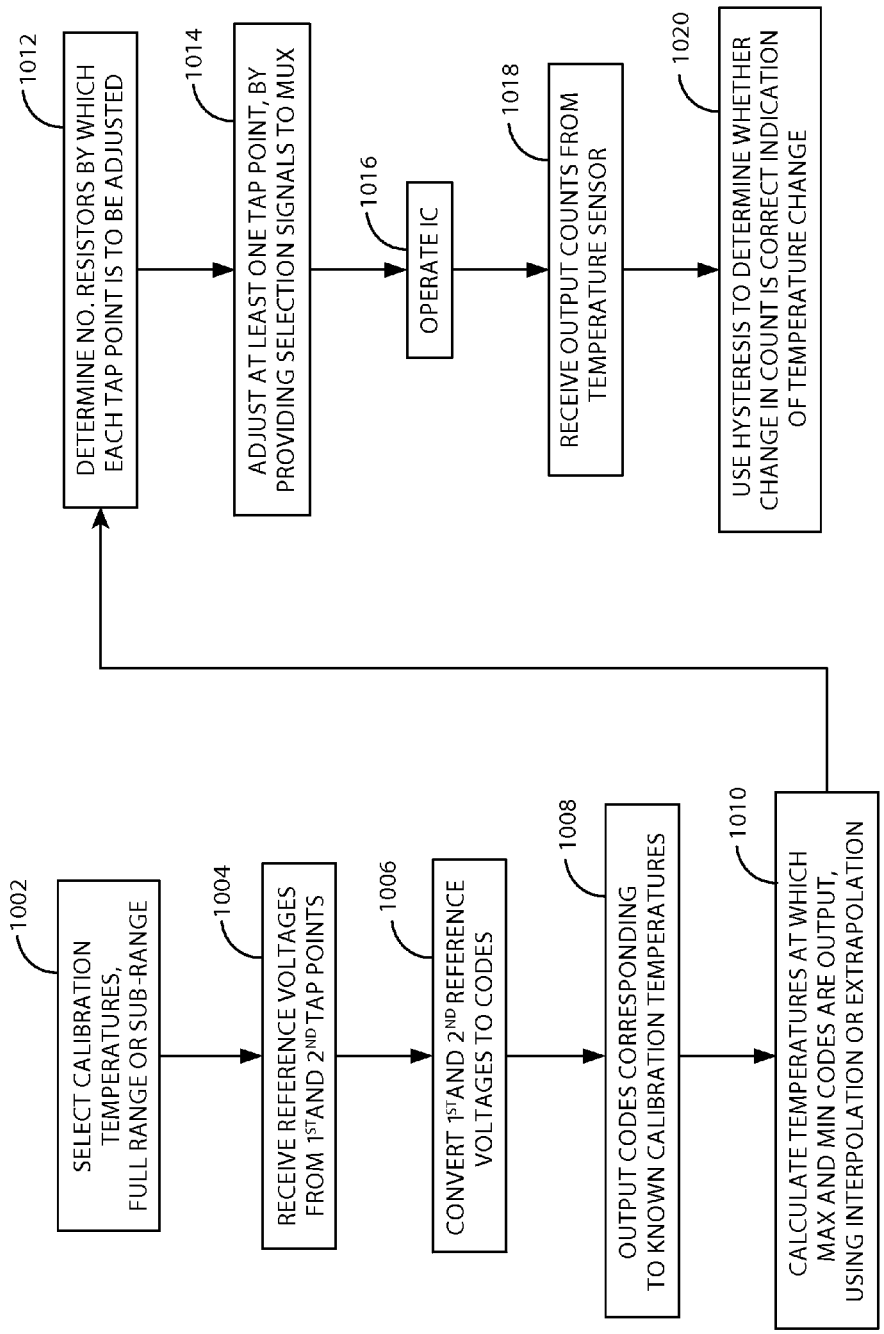
FIG. 10 is a flow chart of a method of calibrating and operating the temperature sensor of FIG. 1.

FIG. 10 is a flow chart providing a high level summary of one example of the method of calibrating and using the temperature sensor 100.

At step 1002 two calibration temperatures are selected for use during the calibration.

At step 1004, the ADC 108 receives the first and second diode voltages VBE1 and VBE2, corresponding to the first and second calibration temperatures. The reference voltages $V_{RP}$ and $V_{RN}$ from the first and second tap points within the bias generation block 104 are set to nominal values.

At step 1006, the first and second diode voltages VBE1 and VBE2 are converted to codes within the ADC 108.

At step 1008, the ADC outputs the codes corresponding to the known calibration temperatures selected in step 1002.

At step 1010, based on the output codes corresponding to the known calibration temperatures, the temperatures $T_{128}$ and $T_0$ at which the maximum and minimum codes are output are calculated using interpolation or extrapolation.

At step 1012, a calculation determines the number of resistors by which each tap point is to be adjusted in order to obtain the appropriate values of reference voltages VRP and VRN. That is, the tap points are determined such that after adjustment the relationship between temperature and output code would have the desired gain and offset.

At step 1014, at least one tap point is adjusted, for example, by providing selection signals to the multiplexer 122 to output the voltages from the desired nodes. The temperature sensor 100 is now calibrated.

At step 1016, the IC 100 is operated.

At step 1018, the accumulate and dump block 110 receives the single bit outputs from Sigma-Delta ADC 108 and counts the bits for a fixed time in order to determine the digital code corresponding to the analog input of the ADC.

At step 1020, in some embodiments, an idle tone killer 112 uses hysteresis to eliminate the effect of the inherent 1 lsb uncertainty associated with single-bit Sima-Delta ADCs.

Figure 4A:
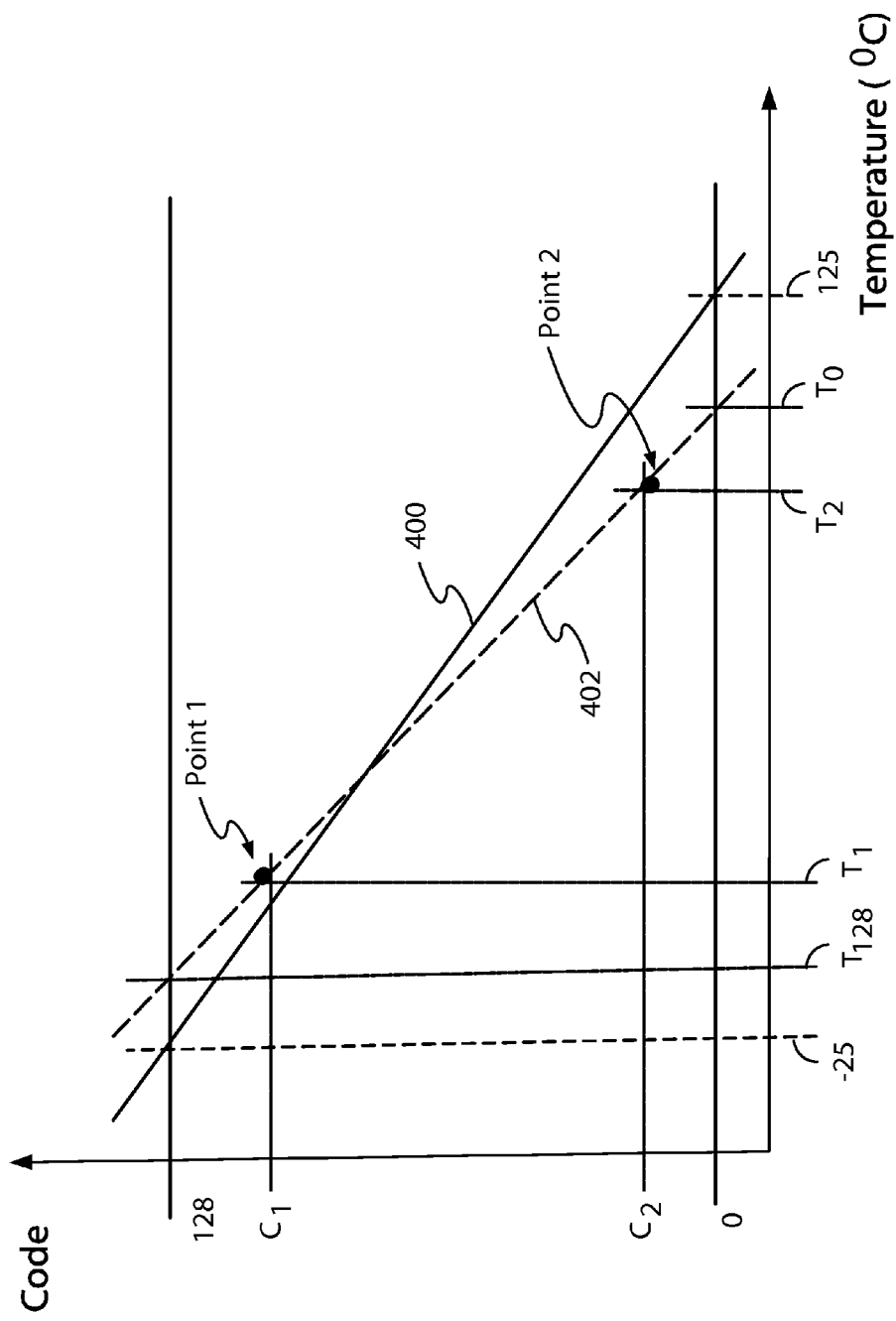
FIG. 4A is a diagram showing an ideal temperature sensor response and the uncalibrated temperature response of the sensor of FIG. 1.

Reference is now made to FIG. 4A. The thermal sensor can be calibrated based on either a one-point or a two-point measurement. A one-point measurement allows for an offset adjustment of the built-in ADC. Using a two-point measurement, both the offset and the slope of the ADC can be adjusted, which results in a significantly more accurate calibration. The two-point calibration procedure is discussed next.

On the graph of FIG. 4A, the solid line 400 is the "ideal curve." On the "ideal curve" 400, a temperature of −25° C. corresponds to a code of 128, and a temperature of 125° C. corresponds to a code of 0. In the actual curve 402 at the two end points, the temperature (marked as T1 and T2 at the bottom) correspond to an output code or a temperature code of C1 and C2, respectively. Thus, the line 402 passing through the two calibration points has a DC offset and a slope error relative to the ideal line 400.

In principle, the two temperatures for the two-point measurement can be chosen arbitrarily over the nominal range of the thermal sensor (−25° C. to 125° C.). In order to guarantee the accuracy of the procedure however, some embodiments stay within a range of −50° C. to 105° C. Some embodiments also maintain a temperature differential of at least 50° C. between the two points.

FIG. 4A shows the behavior of the thermal sensor 100. The X axis shows temperature in ° C., the Y axis the output code between 0 and 128. The solid line 400 represents the ideal (desired) response. The dotted line 402 shows a possible response before calibration. Note that the slope of both lines is negative, reflecting the fact that the output code of the ADC decreases with increasing temperature.

In the ideal case, a temperature of 125° C. results in an output code of 0. A temperature of −25° C. would normally result in a code of 128, but this is clipped to 127. The clipping is performed so all codes can be represented by the 7 bits output of the sensor (TEMPOUT<6:0>). Because this clipping does not affect the slope of any of the lines, it can be ignored in most cases. For the discussion of calibration, assume no clipping occurs.

The ideal response of the sensor is:

$$c = (125 - t)\frac{128}{150},$$

or $$t = 125 - c\frac{150}{128}$$

Before calibration, the thermal sensor will not produce a code of 0 at 125° C. or a code of 128 at −25° C. Instead, code 0 occurs at a temperature $T_0$ and code 128 occurs at a temperature $T_{128}$.

Calibration, Step 1

Before calibration, $T_0$ and $T_{128}$ are unknown. But they can be determined by making a measurement at two different temperatures and using linear interpolation. Calling (T1, c1) the first measurement and (T2, c2) the second measurement, the following holds:

Defining an intermediate variable:

$$\beta = \frac{T_1 - T_2}{c_1 - c_2}$$

$$T_{128} = T_2 - \beta c_2$$

and $$T_0 = T_1 + \beta(128 - c_1)$$

Calibration, Step 2

Once the actual values of $T_{128}$ and $T_0$ are known, adjustments can be made to the ADC reference settings in order to drive both temperatures to their ideal values of −25° C. and 125° C. Both adjustments can be made independently, by changing the digital values of THOFFSETHI<7:0> and THOFFSETLOW<7:0>.

The new values for of THOFFSETHI and THOFFSETLOW are determined by calculating the number of resistor increments to be added or subtracted from the current (pre-calibration) reference settings. This is obtained by dividing the total number of increments between top and bottom reference before calibration by the difference in temperature $T_0 - T_{128}$. Defining an intermediate variable:

$$\gamma = \frac{(\text{\# pre-cal segments})}{T_0 - T_{128}} = \frac{302}{T_0 - T_{128}}$$

This yields the following corrections:

THOFFSETHI=THOFFSETHI+γ($T_0$−125)

and

THOFFSETLOW=THOFFSETLOW+γ($T_{128}$+25)

Temperature Drift of the Reference Voltages

The discussion of the calibration procedure above remains valid, regardless of the actual value of the reference voltages. However, if the reference voltages drift over temperature (e.g. due to a drift of the band-gap reference voltage over temperature), the relationship between temperature and output code may become non-linear. In that case the measurement incurs additional "curvature".

In most cases this curvature error is small and the effect can be ignored. In other words: the two-point calibration can be performed as if the relationship between temperature and output code were linear.

Choice of Calibration Temperatures

Depending on the choice of temperatures used for the two-point calibration, the total after-trim measurement error can be optimized either over the whole nominal range of the sensor, or over a certain sub-range of interest (e.g. temperatures above 80° C.).

The actual sensor response (output code) is not a linear function of temperature. The ADC 108 is a linear converter. To increase the accuracy of the ADC output relative to the sensor code corresponding to actual temperature, one can select the calibration temperatures $T_1$ and $T_2$, anywhere along the X axis so as to linearize over a smaller region, which will be more accurate within that region.

Figure 5:
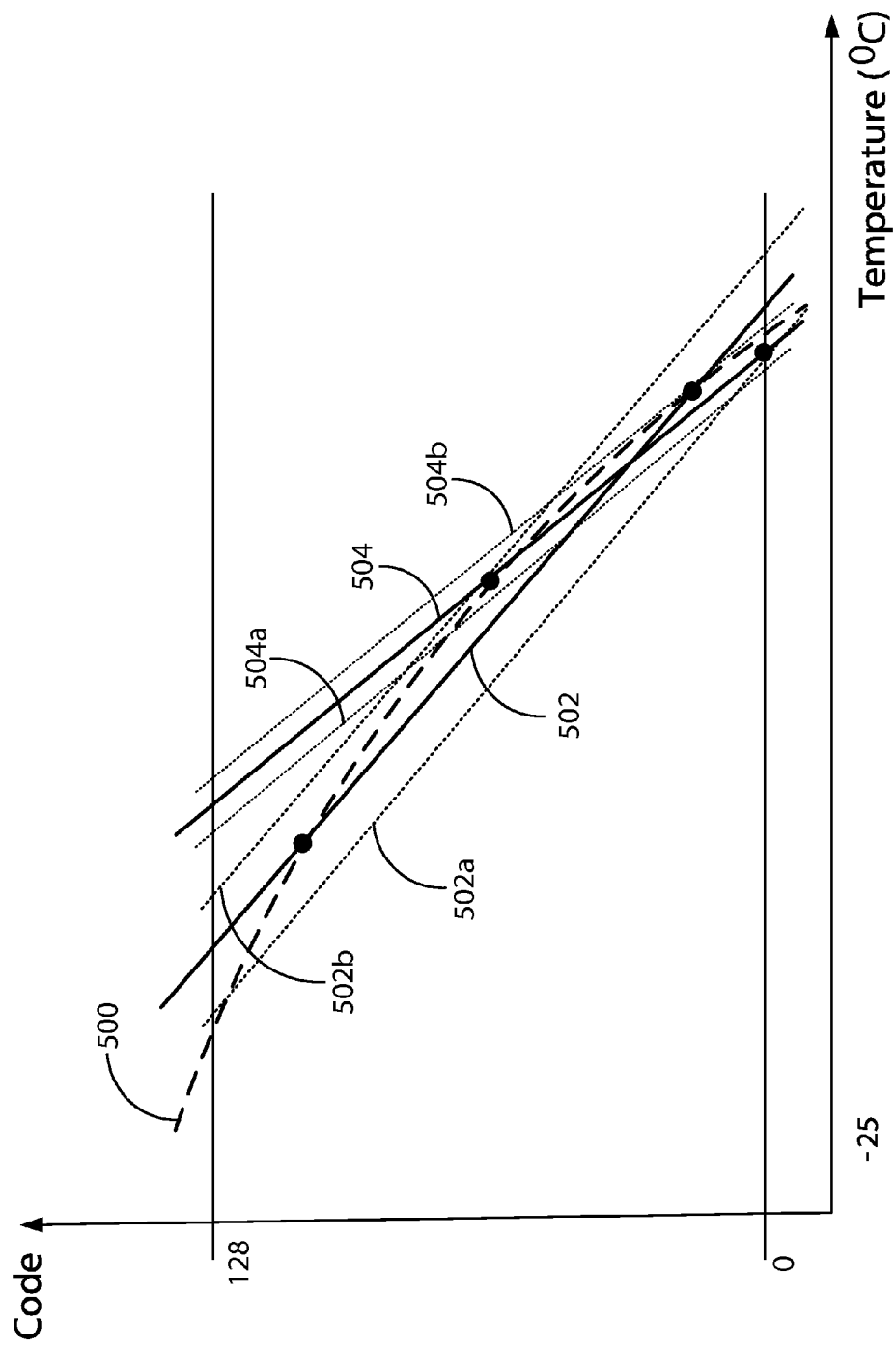
FIG. 5 is a diagram showing the effect of calibrating within a sub-range of the sensor operating temperatures.

Calibrating in a smaller sub-range typically yields a lower measurement error after calibration within that sub-range, but a larger error overall. (Essentially, the codes will be interpolated between the two calibration points, and extrapolated outside of the range between the two calibration points.) This is illustrated in FIG. 5. The dotted line 500 (exhibiting some curvature) is the characteristic of the thermal sensor 100 before calibration. The line 502 is the best linear approximation across the whole range, and the range of error is shown by the dashed lines 502*a*, 502*b*. The line 504 is a linear approximation that minimizes the error at high temperatures, and the range of error is shown by the dashed lines 504*a*, 504*b*.

An example of a calibration is provided below with reference to FIG. 4B.

Figure 4B:
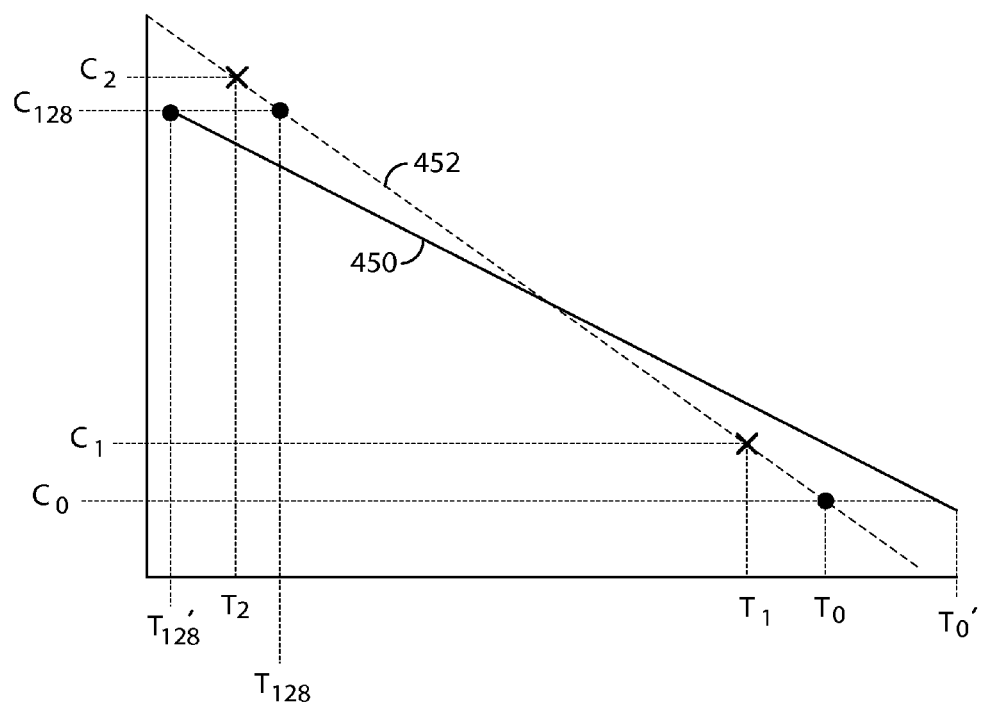
FIG. 4B is a diagram of an example of a calibration using the method.

FIG. 4B introduces parameters and nomenclature. In FIG. 4B, $T_{128}'$ is the temperature at which C=128 in the ideal case. $T_0'$ is the temperature at which c=0 in the ideal case. $T_1$ and $T_2$ are the actual calibration temperatures of the sensor 100 during the calibration measurement. $C_1$=the output of the accumulate and dump block 110 at temperature $T_1$. $C_2$=the output of the accumulate and dump block 110 at temperature $T_2$. The term gamma (γ) is the number of DAC segments or resistor segments per ° C.

The method solves for $T_0$ (the temperature at which $C_1$=0) and $T_{128}$ (the temperature at which $C_2$=$_{128}$), where $T_0$ and $T_{128}$ are based on the actual semiconductor measurements and interpolated from t1/$C_1$ and t2/$C_2$.

In some embodiments, in the untrimmed case there are 256 resistor segments. $V_{RN}$ correlates to the highest temperature and $V_{RP}$ correlates to the lowest temperature. These are referred to as $T_{128}$ and $T_0$, respectively. There are 256 segments between that full temperature range and the untrimmed case.

To determine gamma, assume each resistor segment (FIG. 3) is responsible for a given portion of the temperature range. To trim, the selected subset of segments is modified by adding or subtracting segments at the top and bottom of the subset, so that the dashed line 452 of FIG. 4B is shifted to coincide with, or approximately coincide with, the ideal curve (solid line) 450. In other words, segments are added or subtracted in order to stretch or compress that curve and adjust the slope of line 452 as desired.

In the example of FIG. 4B, a measurement was made at 100° C. With $T_1$=100° C., the output code $C_1$ was 37. And then a code $C_2$=108 corresponds to a temperature $T_2$=20° C.

Then the computation extrapolates for the temperature $T_{128}$ and the temperature $T_0$. For one example of a specification, T128 and T0 ideally would be −25° C. and 125° C., respectively. Absent any error in the codes, $T_{128}$ would be −25° C. and $T_0$ would be 125° C. Because there is an error, by using the computed value of $\gamma$, the calibration values 452 differ from the ideal curve 450 by −5.87 segments. And on the high side, the calibration values 452 differ from the ideal curve 450 by positive 4.37 segments. In various embodiments, the number of segments to be added or subtracted can be rounded up, rounded down, or rounded to the nearest integer. So, in one embodiment, the adjustment changes $V_{RN}$ by −6 segments and change $V_{RP}$ by +4 segments. This essentially shifts the selected subset of the resistor string 124 (FIG. 3) to generate the $V_{RP}$ and $V_{RN}$ internally based on the new number of segments and their corresponding voltages.

In this example, beginning with 256 segments selected from resistor string 124, subtracting 6 segments from the low side and adding 4 segments to the high side yields a final subset containing 254 segments. Ideally, the selected subset of segments to be used is centered within the resistor string 124. In this example, because the number of segments subtracted at the bottom of the subset is greater than the number added at the top of the subset, the subset of segments that are to be used are shifted downward from the subset used in an ideal sensor.

Ideally, the number of segments above the selected subset is the same as the number of segments below the selected subset. For example, given a resistor string (not shown) having 512 segments, if there are 256 segments between $V_{RP}$ and $V_{RN}$ (inclusive), there should be 128 segments above $V_{RP}$ and 128 below $V_{RN}$. In a non-ideal case, $V_{RP}$ and the $V_{RN}$ can be shifted to anywhere within the segments above or below the center 256 segments. And by moving the $V_{RP}$ and $V_{RN}$ independently, the slope changes because the number of segments changes in between $V_{RP}$ and $V_{RN}$. The segments can also shift up or down and change the DC offset. By providing an equal number of segments above and below the 256 segments used in the ideal sensor, the flexibility in adjusting $V_{RP}$ and $V_{RN}$ is maximized. When the number of segments in the selected subset is changed (e.g., from 256 to 254), the slope changes. Because the example tuning block includes the same number of segments above and below the operating range, the tuning segments can be moved anywhere within that larger range.

In various embodiments, depending on whether a 7 bit or a 9 bit device is used, the number of codes will differ. For example, in a 7 bit device, there are a total of $2^7=128$ codes, which correspond to 128 temperatures. This is the basis for using $T_0$ and $T_{128}$ as the ideal endpoints. $T_0$ would ultimately correspond to a code of zero and $T_{128}$ corresponds to the max code of 128 value. In a 9 bit device, there are $2^9=512$ codes, which correspond to 512 temperatures. These are just two examples, and any number of bits can be used, with a corresponding temperature increment size.

Note that any change in the number of segments does not change the number of output bits. It stretches or compresses that dashed line of FIG. 4B, so that the calibration curve 452 will better fit the ideal (solid) line 450.

Given the principles outlined above, the computation is performed as follows:

For the extrapolation, define $\beta = (T_1-T_2)/(C_1-C_2)$ $$T_{128} = T_2 - \beta(C_2 - C_0)$$

$$T_{128} = T_2 - \beta C_2$$

$$T_0 = T_1 + \beta(C_{128} - C_1)$$

$$T_0 = T_1 + \beta(_{128} - C_1)$$

For the trim, define $\gamma$=DAC segments/° C.

In the untrimmed case, number of DAC segments between $C_0$ and $C_{128}$=256.

Since $T_0$ corresponds to $C_0$ and $T_{128}$ corresponds to $C_{128}$, $$\gamma = 256/(T_{128} - T_0)$$

$$\text{THoffsetHI} = (T_0' - T_0)\gamma$$

$$\text{THoffsetLOW} = (T_{128}' - T_{128})\gamma$$

Thus, THoffsetHI and THoffsetLOW determine the number of resistance segments (shown in FIG. 3) to be added to, or subtracted from, the nominal 256 segments to achieve the desired DC offset trimming adjustment, and the desired slope trimming adjustment.

Example Calculation $$C1 = 37 \ @ \ T1 = 100° \text{ C.}$$

$$C2 = 108 \ @ \ T2 = 20° \text{ C.}$$

$$T_{128} = 20° \text{ C.} - ((100° \text{ C.} - 20° \text{ C.})/(108 - 37))(37)$$

$$T_{128} = 20° \text{ C.} - (1.1268)(37)$$

$$T_{128} = 20° \text{ C.} - 41.69$$

$$T_{128} = -21.69° \text{ C.}$$

$$T_0 = 100° \text{ C.} + ((100 \text{ C.} - 20° \text{ C.})/(108 - 37))(128 - 108)$$

$$T_0 = 100° \text{ C.} + (1.1268)(20)$$

$$T_0 = 100° \text{ C.} + 22.536° \text{ C.}$$

$$T_0 = 122.536° \text{ C.}$$

$$\text{THoffsetlow} = (-25° \text{ C.} - -21.69° \text{ C.})(256/122.536 - (-21.69))$$
$$= (-25° \text{ C.} - -21.69° \text{ C.})(1.775)$$
$$= 5.8753 \text{ segments}$$

$$\text{THoffsethigh} = (125° \text{ C.} - 122.536° \text{ C.})(\gamma)$$
$$= (125° \text{ C.} - 122.536° \text{ C.})(1.795)$$
$$= 4.3736 \text{ segments}$$

The method described herein measures those two points and mathematically extrapolates those points to determine the deviation from the ideal line and to fit the selected trim resistors to return the output of the calibrated sensor (the dotted line 402, FIG. 4A) back on top of that ideal curve (solid line) 400, FIG. 4A.

In the example above, linear interpolation is used. In other embodiments, either some higher order interpolation or extrapolation is used. In other embodiments, a different kind of ADC is used. For higher order curve fitting, more than two calibration points are measured. For example, for a second order curve and quadratic interpolation, three calibration points are used. The method does not necessarily measure the linearity, but the method does measure the slope error. Thus, a higher order curve can reduce errors due to non-linearity of the actual temperature response of the diode.

Trimming Examples

Figure 6A:
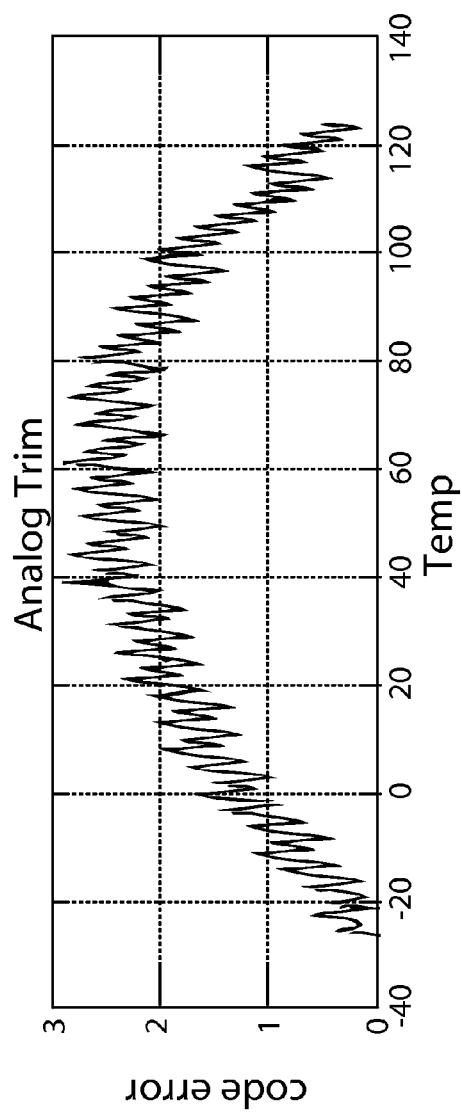
FIG. 6A is a diagram of sensor error using an analog trim.
Figure 6B:
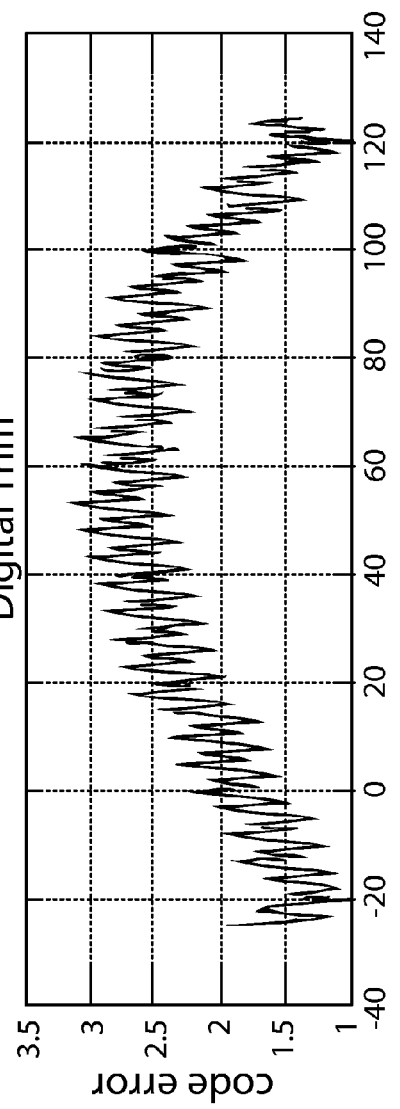
FIG. 6B is a diagram of sensor error using the digital trim method, using the same sensor and calibration points as FIG. 6A.

FIGS. 6A and 6B are an example calibrated at different points, using the full operating range of the sensor, and an ADC 108 with 9-bit accuracy. FIG. 6A shows an analog trim. This analog trim shows what would happen if the reference voltages of the ADC were adjusted to their ideal values. And then FIG. 6B shows a digital trim as described above in comparison to the analog trim result. The two overlay almost perfectly. Both curves (FIGS. 6A and 6B measure the non-linearity as well as the DC offset. The full range was −25° C. to 125° C. Here the $T_0$ and $T_1$ trim points are at the two-way extremes, at −20° C. and 120° C. Both FIGS. 6A and 6B show the code error. For an ideal (linear) temperature sensor, that code error would be zero throughout the range. That is, linearly interpolating along a linear temperature response curve would not cause an error. The error is caused by a linear approximation of a signal that has a small curvature in the relevant range.

An acceptable level of code error for any given device can be determined by the device's specification. For example, in FIGS. 6A-6B, maximum errors below four codes are within specification.

FIG. 7B shows a digital trimming method as described above using calibration temperatures 35° C. and 100° C., compared to the analog trim result of FIG. 7A, using the full range of the sensor, and an ADC 108 with 9-bit accuracy. In FIG. 7A, the temperatures $T_0$ and $T_1$, are measured. The analog trim of FIG. 7A is the same as FIG. 6A. But the digital trim FIG. 7B, is relatively flat and has the least amount of code error right around and between the temperature points 35 and 100 (where calibration data were collected) the curve. So in FIG. 7A, the code errors are minimum at the two extremes −25° C. and 125° C., and highest in the range from 35° C. to 100° C. But in FIG. 7B, because of the technique uses measured data at 35° C. and 100° C., the error is actually lowest from 35° C. to 100° C. and the error is greater in the extrapolated regions below 35° C. and above 100° C. Thus, FIG. 7B shows how the calibration points can be selected to optimize the error in a selected sub-range.

The method and equations described herein take a snapshot between two temperatures and linearly interpolate in between. When the curve is linearized over that sub-range, the extreme ends of the curve (outside of the operating range) tend to have the largest error, instead of that section of the curve within the operation range. In this example (FIG. 7B) from 35° C. to 100° C. the method permits the user to linearize over different regions, thus providing higher accuracy in the operating range from 35° C. to 100° C.

Thus, with the digital trim, even using a linear interpolation and slope correction, by selecting the calibration points that match the operating range one can get rid of most non-linearity in the operating range.

FIG. 8B shows another example, calibrating in a range from 60° C. to 155° C. Compared to the analog trim of FIG. 8A, the non-linearity code error is eliminated between 60° C. and 115° C.

An alternative computation is provided below. According to the alternative computation, at a given code, there should be an ideal temperature, and the actual measured temperature that corresponds to that given code.

To compute this code one sets the temperature of the die to an exact predetermined temperature. For example, in one embodiment, an ideal sensor outputs a code zero at a temperature of 125° C., but the code zero is not actually output at 125° C. So the temperature on the tester is adjusted until a code zero is output by the temperature sensor. And then that temperature (referred to below as "T") is read off the tester.

Cmin and Cmax, are selected so that the minimum code is going to be zero. And the maximum code is 127, or 255 or the actual minimum and maximum code that can come out of the ADC 108.

$V_{RP}$ and $V_{RN}$, can be adjusted independently. Instead of performing the intermediate calculations using the number of segments, the calculations are made based on voltage. At the end of the calculation, the segments corresponding to the voltages are determined. That is, the correspondence between the calculated voltages and the voltages that correspond to integral numbers of segments is determined. The segments nearest to those voltages are selected as the endpoints. The adjustment can be made using calibration DACs on the reference system. Here, the calibration DACs refers to the resistor segments within the bias generator 104 of FIG. 1.

$t_{max}$: temperature at which code is maximum ($c_{max}$)
Ideally, $t_{max}$ results in $V_{BE}=V_{refp}$
$t_{min}$: temperature at which code is minimum ($c_{min}$)
Ideally, $t_{min}$ results in $V_{BE}=V_{refm}$
c: ADC output code at temperature t
Step 1. Determining $t'_{max}$ and $t'_{min}$
Ideal situation (tmin and tmax are ideal references):
No offset or gain error $$c_{ideal} = c_{min} + \frac{t - t_{min}}{t_{max} - t_{min}}(c_{max} - c_{min})$$

Real situation (t'min and t'max instead of tmin and tmax):
Note that Cmax and Cmin never change $$c = c_{min} + \frac{t - t'_{min}}{t'_{max} - t'_{min}}(c_{max} - c_{min})$$

2-Point measurement at temperatures t1 and t2:

$$c_1 = c_{min} + \frac{t_1 - t'_{min}}{t'_{max} - t'_{min}}(c_{max} - c_{min})$$

$$c_2 = c_{min} + \frac{t_2 - t'_{min}}{t'_{max} - t'_{min}}(c_{max} - c_{min})$$

Or, rearranging the equations:

$$\frac{(c_1 - c_{min})}{(c_{max} - c_{min})}(t'_{max} - t'_{min}) = t_1 - t'_{min}$$

$$\frac{(c_2 - c_{min})}{(c_{max} - c_{min})}(t'_{max} - t'_{min}) = t_2 - t'_{min}$$

$$t'_{max}\frac{(c_1 - c_{min})}{(c_{max} - c_{min})} + t'_{min}\left(1 - \frac{(c_1 - c_{min})}{(c_{max} - c_{min})}\right) = t_1$$

$$t'_{max}\frac{(c_2 - c_{min})}{(c_{max} - c_{min})} + t'_{min}\left(1 - \frac{(c_2 - c_{min})}{(c_{max} - c_{min})}\right) = t_2$$

Or substituting ai for $$\frac{(c_i - c_{min})}{(c_{max} - c_{min})}$$

$$t'_{max}\alpha_1 + t'_{min}(1 - \alpha_1) = t_1$$

$$t'_{max}\alpha_2 + t'_{min}(1 - \alpha_2) = t_2$$

Solving for t'min:

$$t'_{min}\alpha_2(1 - \alpha_1) - t'_{min}\alpha_1(1 - \alpha_2) = t_1\alpha_2 - t_2\alpha_1$$

$$t'_{min}(\alpha_2 - \alpha_1) = t_1\alpha_2 - t_2\alpha_1$$

$$t'_{min} = \frac{t_1\alpha_2 - t_2\alpha_1}{\alpha_2 - \alpha_1}$$

Solving for t'max:

$$t'_{max}\alpha_1(1-\alpha_2) - t'_{max}\alpha_2(1-\alpha_1) = t_1(1-\alpha_2) - t_2(1-\alpha_1)$$

$$t'_{max}(\alpha_1 - \alpha_2) = t_1(1-\alpha_2) - t_2(1-\alpha_1)$$

$$t'_{max} = \frac{t_1(1-\alpha_2) - t_2(1-\alpha_1)}{\alpha_1 - \alpha_2}$$

Step 2. Adjusting $V_{min}$ and $V_{max}$
After the 2-point measurement, the following is known:
DAC Setting of V'min yields actual min temp of t'min
DAC Setting of V'max yields actual min temp of t'max
We now need to determine new values of Vmin and Vmax,
So t'min and t'max take on ideal (desired) values, tmin and tmax.
Fortunately, Vmin and Vmax can be adjusted independently
(a change in one does not affect the code of the other).
Therefore, simple linear algebra can be used again.
Write relationship between any V (setting) and t' (temp), using linear interpolation.

$$\frac{V - V'_{min}}{V'_{max} - V'_{min}} = \frac{t - t'_{min}}{t'_{max} - t'_{min}}$$

Solve for V (t is given):

$$V = V'_{min} + \frac{t - t'_{min}}{t'_{max} - t'_{min}}(V'_{max} - V'_{min})$$

Calculate new Vmin and Vmax values.
(tmin and tmax are desired (ideal) min and max temperatures)

$$V_{min} = V'_{min} + \frac{t_{min} - t'_{min}}{t'_{max} - t'_{min}}(V'_{max} - V'_{min})$$

$$V_{max} = V'_{min} + \frac{t_{max} - t'_{min}}{t'_{max} - t'_{min}}(V'_{max} - V'_{min})$$

Example: Thermal Sensor
Temperature range: −25 C to 125 C (150 C total)
$t_{min}$=−25 C
$t_{max}$=125 C
Nominal thermal diode voltage range (2 mV/C):
700 mV (−25 C)
400 mV (125 C)
Nominal reference voltages:
$V_{min}$=700 mV
$V_{max}$=400 mV
Output codes (7 bits unsigned binary):
0 (00000000) @ −25 C
128 (10000000) @ 125 C
Two-Point Measurement Example
Measurement 1 @ 20 C, Measurement 2 @ 100 C
Expected values (if there were perfect trim)

$$c_1 = (20-(-25))/150*128 = 38.4$$

$$c_2 = (100-(-25))/150*128 = 106.7$$

Actual (measured) values
$c_1$=37
$c_2$=108
Calculating Actual Values, $t'_{max}$ and $t'_{min}$
Calculating $a_1$ and $a_2$:

$$a_1 = (c_1 - c_{min})/(c_{max} - c_{min}) = (37-0)/128 = 0.289$$

$$a_2 = (c_2 - c_{min})/(c_{max} - c_{min}) = (108-0)/128 = 0.844$$

Calculating actual min and max temperatures $$t'_{min} = (t_1 a_2 - t_2 a_1)/(a_2 - a_1)$$

$$t'_{max} = (t_1(1-a_2) - t_2(1-a_1))/(a_1 - a_2)$$

$$t'_{min} = (20*0.844 - 100*0.289)/(0.844 - 0.289) = -21.7\ C$$

$$t'_{max} = (20*0.156 - 100*0.711)/(-0.555) = 122.5\ C$$

Calculating New Reference Voltages $$V_{min} = V'_{min} + \frac{t_{min} - t'_{min}}{t'_{max} - t'_{min}}(V'_{max} - V'_{min})$$

$$V_{max} = V'_{min} + \frac{t_{max} - t'_{min}}{t'_{max} - t'_{min}}(V'_{max} - V'_{min})$$

$$V_{min} = 0.700 + \frac{(-25)-(-21.7)}{122.5-(-21.7)}(0.400 - 0.700) = 0.707$$

$$V_{max} = 0.700 + \frac{125-(-21.7)}{122.5-(-21.7)}(0.400 - 0.700) = 0.395$$

A two-point measurement can be used to calculate the non-ideal min an max temperatures (reference levels) directly Once the two actual temperatures are determined, they can be used to adjust the $V_{refm}$ and $V_{refp}$ ($V_{max}$ and $V_{min}$) levels of the ADC The adjustment can be made using the calibration DACs on the reference system. DAC errors are automatically taken into account.

This analysis has provided a set of closed formulas allowing the calculations to be made in one pass.

Idle tone killer.112

In some embodiments, the code is read out of the accumulate and dump block 110. In other embodiments, the code is read from the idle tone killer 112. The idle tone killer 112 is an optional hysteresis element that removes artifacts from the digital signal. Details of the idle tone killer 112 are described in U.S. patent application Ser. No. 13/481,990, filed May 29, 2012, which is incorporated by reference herein in its entirety.

The ADC 108 digitizes the amount of error by integration. Digital information (e.g., a bit) can be left from the sampling process and this left over information remains on the integration capacitors and adds up, eventually causing an improper increase or decrease to the next quantization level. Unless suppressed, these artifacts would appear as an incorrect digital output code.

The accumulate and dump block 110 maintains a first-in, first-out (FIFO) queue of recent codes output by the ADC 108. The accumulate and dump block can be implemented using registers, dynamic random access memory (DRAM), or other non-transitory machine readable storage devices.

The idle tone killer 112, which accepts sigma-delta ADC digital output codes from the accumulate and dump block 110, determines if an individual code is valid or not, and outputs a digital code based on that determination. The digital filter that employs hysteresis to determine if an output code change is really the product of change in the input level or rather the product of leftover accumulated (i.e., idle) information from the quantization process. If it is determined that there truly was a change, then the changed code is outputted by Idle Tone Killer. Otherwise, if it determined that the change was a result of left over information, the change is rejected and the outputted code remains unchanged.

The hysteresis removes artifacts from the signal. For example, if the accumulate and dump block 110 is merely collecting small remainders at each cycle, the output of the accumulate and dump block 110 can appear as: 10, 10, 10, . . . , 10, 11, 10, 10, 10. For this sequence, the idle tone killer 112 would merely output a continuous series of "10", because the idle tone killer 112 would recognize that that the signal did not really change to 11. On the other hand, in case the temperature actually changes and the signal train is 10, 10, 10, 11, 11, 11. The hysteresis in the idle tone killer 112 would wait for two or three repeats of the "11" before the idle tone killer 112 starts to outputting the 11. It resists the change and includes an element such as a hysteretic input buffer or a Schmidt trigger, or the like, that resists the change until it can confirms that a criterion is met indicating that the signal really has changed.

Figure 9:
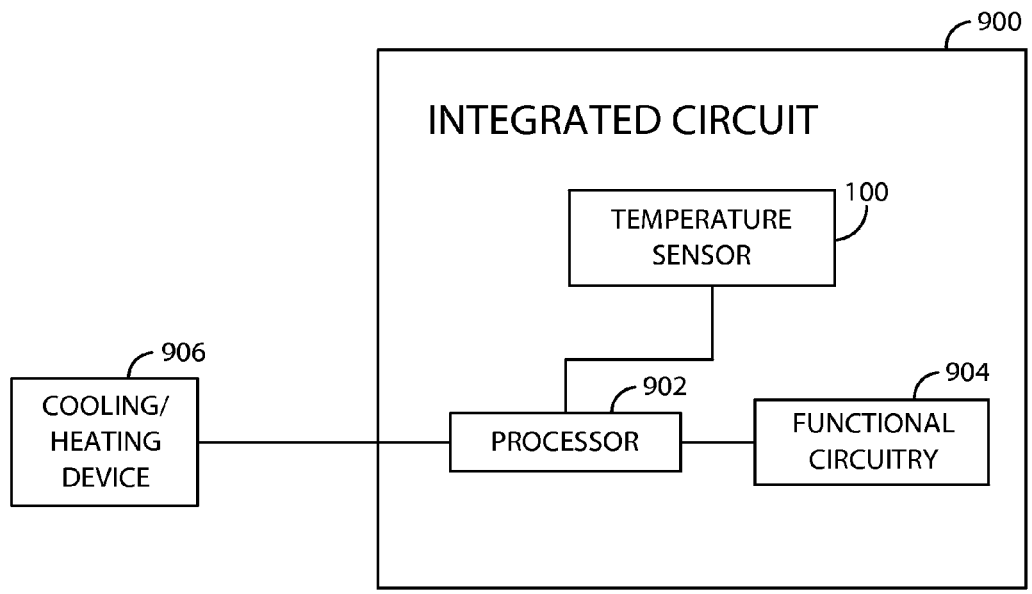
FIG. 9 is a block diagram of an integrated circuit (IC) die containing the temperature sensor of FIG. 1.

FIG. 9 is a block diagram of an IC die 900 including the temperature sensor 100 of FIG. 1. The IC 900 further includes functional circuitry 904. The temperature sensor 100 senses the temperature of the IC 900 during operation, to allow the functional circuitry 904 to be operated within its specification temperature range. In some embodiments, the functional circuitry 904 is a general purpose processor or an embedded processor, and block 902 is omitted. In other embodiments, the functional circuitry 904 is a special purpose circuit, such as but not limited to a network interface, graphics interface, memory, or other device. In some embodiments having special purpose functional circuitry 904, a processor 902 is provided in the IC 900. The processor 902 can be a general purpose processor, or a special purpose processor configured for performing the trim operation, transmitting the trim codes to the multiplexer 122, and transmitting the output codes (or temperature derived from the codes) from the sensor 100 to an external processor. The processor 902 can be configured to compare the output code (or corresponding temperature) to setpoint values, and activating a heating or cooling device 906 if the sensed temperature is below the lower setpoint or above the upper setpoint. The heating/cooling device 906 can contain either or both of a heating element and a cooling device. The cooling device can be a fan, thermoelectric cooler, or the like.

In some embodiments, a method for calibrating a temperature sensor comprises: receiving first and second reference voltages from respective first and second tap points within a string of sequentially connected resistive devices of the temperature sensor, each resistive device having a resistance that varies as a function of temperature, the receiving performed at two or more known temperatures; outputting a respective code corresponding to each respective one of the two or more known temperatures, based on the first and second reference voltages; and adjusting at least one of the tap points, based on the two or more known temperatures and the respective output codes.

In some embodiments, a temperature sensor comprises: a string of sequentially connected resistive devices, outputting first and second reference voltages from respective first and second tap points within the string, each tap point provided at a respective node between an adjacent pair of the string of resistive devices, each resistive device having a resistance that varies as a function of temperature; a selector for selecting the first and second tap points in response to at least two trim codes; and an analog-to-digital converter (ADC) configured to output a respective code corresponding to the first and second reference voltages.

In some embodiments, an integrated circuit comprises: a processor; a string of sequentially connected resistive devices for sensing a temperature of the processor and outputting first and second reference voltages from respective first and second tap points within the string, each tap point provided at a respective node between an adjacent pair of the string of resistive devices, each resistive device having a resistance that varies as a function of temperature; a selector for selecting the first and second tap points in response to at least two trim codes; and an analog-to-digital converter (ADC) configured to output a respective code corresponding to the first and second reference voltages.

Although the subject matter has been described in terms of exemplary embodiments, it is not limited thereto. Rather, the appended claims should be construed broadly, to include other variants and embodiments, which may be made by those skilled in the art.

What is claimed is:

1. A method for calibrating a temperature sensor, comprising:
   receiving first and second reference voltages from respective first and second tap points within a string of sequentially connected resistive devices of the temperature sensor, each resistive device having a resistance that varies as a function of temperature, the receiving performed at two or more known temperatures;
   outputting a respective code corresponding to each respective one of the two or more known temperatures, based on the first and second reference voltages provided at the same time from the first and second tap points, respectively; and
   adjusting at least one of the tap points, based on the two or more known temperatures and the respective output codes.

2. The method of claim 1, wherein the outputting comprises converting the first and second reference voltages to a corresponding code in an analog to digital converter (ADC), and the ADC outputs the code.

3. The method of claim 2, wherein the ADC is a delta-sigma ADC.

4. The method of claim 1, wherein a first end of the string of resistive devices is coupled to receive a band gap voltage signal from a band gap reference voltage circuit.

5. The method of claim 1, wherein the two or more known temperatures include a first temperature near a lower end of an operating range of the temperature sensor, and a second temperature near an upper end of an operating range of the temperature sensor.

6. The method of claim 1, further comprising, before the adjusting, the steps of:
   using interpolation or extrapolation to calculate:
   a first temperature at which a maximum code is output from the temperature sensor, and
   a second temperature at which a minimum code is output from the temperature sensor.

7. The method of claim 6, further comprising, before the adjusting, the steps of determining a number of resistive devices by which the first tap point is to be adjusted, so that the maximum code is to be output at a lowest temperature of the operating range; and determining a number of resistive devices by which the second tap point is to be adjusted, so that the minimum code is to be output at a highest temperature of the operating range.

8. The method of claim 1, wherein the adjusting includes providing selection signals to a multiplexer, the multiplexer having inputs connected to respective tap points between each pair of adjacent resistive devices in the string.

9. The method of claim 1, further comprising:
selecting as the known temperatures first and second temperatures corresponding to a sub-range of temperatures contained within an operating range of the temperature sensor, so as to maximize accuracy of the temperature sensor while operating with the sub-range of temperatures.

10. The method of claim 1, further comprising sensing temperatures after the adjusting step, the sensing including:
sequentially receiving a plurality of output codes from the temperature sensor;
using hysteresis to determine whether a change in the sequentially received codes is a correct indication of a change in temperature of the temperature sensor.

11. The method of claim 1, wherein said adjusting at least one of the tap points comprises adjusting the first and second tap points.

12. A temperature sensor, comprising:
a string of sequentially connected resistive devices, outputting first and second reference voltages from respective first and second tap points within the string, each tap point provided at a respective node between an adjacent pair of the string of resistive devices, each resistive device having a resistance that varies as a function of temperature;
a selector for selecting the first and second tap points in response to at least two trim codes; and
an analog-to-digital converter (ADC) configured to output a respective code on the first and second reference voltages provided at the same time from the first and second tap points, respectively.

13. The temperature sensor of claim 12, further comprising:
a band gap reference voltage circuit configured to provide a temperature independent band gap voltage to a first end of the string of resistive devices.

14. The temperature sensor of claim 12, wherein the selector is a multiplexer.

15. The temperature sensor of claim 12, wherein the ADC is a delta-sigma ADC.

16. The temperature sensor of claim 15, wherein the string of resistive devices contains about $2^{N+1}$ resistive devices.

17. An integrated circuit, comprising:
a processor;
a string of sequentially connected resistive devices for sensing a temperature of the processor and outputting first and second reference voltages from respective first and second tap points within the string, each tap point provided at a respective node between an adjacent pair of the string of resistive devices, each resistive device having a resistance that varies as a function of temperature;
a selector for selecting the first and second tap points in response to at least two trim codes; and
an analog-to-digital converter (ADC) configured to output a respective code based on the first and second reference voltages provided at the same time from the first and second tap points, respectively.

18. The integrated circuit of claim 17, wherein the processor is configured to provide the at least two trim codes to the selector.

19. The integrated circuit of claim 17, further comprising:
a band gap reference voltage circuit configured to provide a temperature independent band gap voltage to a first end of the string of resistive devices.

20. The integrated circuit of claim 17, wherein the selector is a multiplexer.

21. The integrated circuit of claim 20, further comprising:
a functional circuit near the temperature sensor, the functional circuit selected from the group consisting of a network interface, a graphics interface, or a memory.

* * * * *